(12) United States Patent
Taguchi et al.

(10) Patent No.: US 8,237,189 B2
(45) Date of Patent: *Aug. 7, 2012

(54) HEAT-CURABLE SILICONE RESIN-EPOXY RESIN COMPOSITION, AND PREMOLDED PACKAGE MOLDED FROM SAME

(75) Inventors: Yusuke Taguchi, Annaka (JP); Toshio Shiobara, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 474 days.

This patent is subject to a terminal disclaimer.

(21) Appl. No.: 12/496,460

(22) Filed: Jul. 1, 2009

(65) Prior Publication Data

US 2010/0001311 A1    Jan. 7, 2010

(30) Foreign Application Priority Data

Jul. 2, 2008 (JP) ................................. 2008-173437

(51) Int. Cl.
 *H01L 33/00* (2010.01)
(52) U.S. Cl. ................... 257/100; 257/40; 257/E33.059
(58) Field of Classification Search .................... 257/40, 257/100
See application file for complete search history.

(56) References Cited

U.S. PATENT DOCUMENTS

| | | | |
|---|---|---|---|
| 6,124,381 A * | 9/2000 | Miyake et al. ................. 523/461 |
| 6,465,552 B1 * | 10/2002 | Chorvath et al. ............. 524/323 |
| 6,924,596 B2 | 8/2005 | Sato et al. | |
| 7,579,066 B2 * | 8/2009 | Nozawa et al. ............... 428/209 |
| 8,044,128 B2 * | 10/2011 | Sawada et al. ................ 524/147 |
| 2002/0089071 A1 | 7/2002 | Sumita et al. | |
| 2003/0027899 A1 | 2/2003 | Takasaki et al. | |
| 2003/0132701 A1 | 7/2003 | Sato et al. | |
| 2004/0023120 A1 * | 2/2004 | Nishikubo et al. ........... 429/253 |
| 2004/0249044 A1 | 12/2004 | Nguyenquang et al. | |
| 2006/0204760 A1 | 9/2006 | Ito | |
| 2008/0255283 A1 * | 10/2008 | Aoki et al. ................... 524/300 |

FOREIGN PATENT DOCUMENTS

| | | |
|---|---|---|
| EP | 0355728 A2 | 2/1990 |
| EP | 1914811 A1 | 4/2008 |
| JP | 57-90965 A | 6/1982 |
| JP | 2-187421 A | 7/1990 |
| JP | 7-97434 A | 4/1995 |
| JP | 2656336 B2 | 5/1997 |
| JP | 2000196151 A | 7/2000 |
| JP | 2001-234032 A | 8/2001 |
| JP | 2001-278955 A | 10/2001 |
| JP | 2001-342326 A | 12/2001 |
| JP | 2002-302533 A | 10/2002 |
| JP | 2002-327044 A | 11/2002 |
| JP | 2003-224305 A | 8/2003 |
| JP | 3512732 B | 1/2004 |
| JP | 2005-306952 A | 11/2005 |
| WO | WO-2007/015427 A1 | 2/2008 |

OTHER PUBLICATIONS

Database WPI Week 198228, Thomson Scientific, London, GB; AN 1982-58291E, XP-002550831.
Database WPI Week 199523, Thomson Scientific, London, GB., AN 1995-175387. XP-002553518.
International Search Report in PCT/JP2006/314971 issued Sep. 19, 2006.
Search Report issued in EP09008627.3 on Nov. 12, 2009.
Miyawaki et al., "Resin for White LED and New Technology of LED Package", Electronic Package Technology, vol. 20, No. 4, pp. 22-29, 2004.
Translation of Office Action dated Mar. 31, 2012 for corresponding Chinese Application No. 200910166919.7.

* cited by examiner

*Primary Examiner* — Benjamin Sandvik
(74) *Attorney, Agent, or Firm* — Birch, Stewart, Kolasch & Birch, LLP

(57) ABSTRACT

A heat-curable silicone resin-epoxy resin composition that is ideal as a premolded package for a high-brightness LED or solar cell. The composition contains (A) a heat-curable silicone resin, (B) a combination of a triazine derivative epoxy resin and an acid anhydride, or a prepolymer obtained by reaction of them, (C) an inorganic filler, and (D) a curing accelerator. The composition exhibits excellent curability, and yields a uniform cured product that displays excellent retention of heat resistance and light resistance over long periods of time, and suffers minimal yellowing.

5 Claims, No Drawings

HEAT-CURABLE SILICONE RESIN-EPOXY RESIN COMPOSITION, AND PREMOLDED PACKAGE MOLDED FROM SAME

BACKGROUND OF THE INVENTION

1. Field of the Invention

The present invention relates to a heat-curable resin composition that has excellent curability, and yields a cured product that exhibits excellent heat resistance, light resistance and ultraviolet light resistance, has good strength, and is resistant to discoloration and particularly yellowing upon heating, and therefore offers excellent reliability. The present invention also relates to a premolded package for an LED or solar cell that is molded from a cured product of the above composition, and an LED device that uses such a premolded package.

2. Description of the Prior Art

Achieving the required level of reliability for the encapsulating materials used for encapsulating semiconductor and electronic devices is becoming more and more difficult as the devices become thinner and smaller, and have increasingly higher outputs. For example, semiconductor elements such as LED or LD (laser diode) are small, emit a bright colored light with good efficiency, and because they are semiconductor elements, do not suffer from lamp blowout, exhibit excellent drive performance, and have superior durability to vibration and repeated ON/OFF switching. As a result, they are widely used for all manner of indicator lights and light sources.

Polyphthalamide resins (PPA) are currently widely used as one of the materials for packages that use these types of optical semiconductor elements such as LED.

However, the dramatic progress currently being made in optical semiconductor technology has resulted in marked increases in the output of these optical semiconductors and a significant shortening of the wavelength. As a result, in semiconductor devices such as photocouplers that are capable of emitting or receiving high-energy light, semiconductor element-encapsulating resins or cases that use a conventional PPA resin as a colorless or white material tend to suffer marked deterioration upon prolonged use of the device, resulting in various problems such as color irregularity, peeling of the encapsulating resin, and reduction in the mechanical strength of the device. Effectively resolving these problems is highly desirable.

More specifically, JP 2,656,336 B (Patent Document 1) discloses a B-stage epoxy resin composition for encapsulating an optical semiconductor, which includes an epoxy resin, a curing agent and a curing accelerator as the structural components of the encapsulating resin, and in which the composition is composed of a cured product of a resin composition in which the above structural components are mixed together uniformly at the molecular level. In this case, a bisphenol A epoxy resin or bisphenol F epoxy resin is mainly used as the epoxy resin, although the document mentions that other resins such as triglycidyl isocyanate may also be used. However, in the examples of Patent Document 1, the triglycidyl isocyanate is only added in a small amount to a bisphenol epoxy resin, and according to investigations conducted by the inventors of the present invention, the resulting B-stage epoxy resin composition for encapsulating a semiconductor suffers from yellowing, particularly when left to stand for long periods at high temperature.

Furthermore, the use of a triazine derivative epoxy resin within an epoxy resin composition used for encapsulating a light-emitting element has been disclosed in JP 2000-196151 A (Patent Document 2), JP 2003-224305 A (Patent Document 3), and JP 2005-306952 A (Patent Document 4). However, if a high-brightness LED is mounted on a package or the like prepared using this type of resin composition, then the package tends to discolor upon prolonged illumination of the LED.

In addition to the documents mentioned above, other known publications relating to the present invention include Patent Documents 5 to 7 and Non-Patent Document 1 listed below.

[Patent Document 1] JP 2,656,336 B
[Patent Document 2] JP 2000-196151 A
[Patent Document 3] US 2003/0132701 A1
[Patent Document 4] JP 2005-306952 A
[Patent Document 5] JP 3,512,732 B
[Patent Document 6] JP 2001-234032 A
[Patent Document 7] JP 2002-302533 A
[Non-Patent Document 1] Electronic Packaging Technology, 2004. 4 edition

SUMMARY OF THE INVENTION

The present invention has been developed in light of the above circumstances, and has an object of providing a heat-curable resin composition which, by using a hybrid material of a silicone resin and an epoxy resin, yields a uniform cured product that exhibits improved strength for the silicone resin, displays excellent retention of heat resistance and light resistance over long periods of time, and suffers minimal yellowing. Another object of the present invention is to provide a premolded package for an LED that is molded from a cured product of the above composition.

As a result of intensive investigation aimed at achieving the above objects, the inventors of the present invention discovered that a heat-curable silicone resin-epoxy resin composition composed of a heat-curable silicone resin, a triazine derivative epoxy resin, an acid anhydride, a curing accelerator, and an inorganic filler exhibited excellent curability and yielded a cured product having excellent heat resistance and light resistance as well as favorable strength, and they were therefore able to complete the present invention.

In other words, a first aspect of the present invention provides a heat-curable silicone resin-epoxy resin composition comprising:

(A) a heat-curable silicone resin,
(B) a combination of a triazine derivative epoxy resin (B-1) and an acid anhydride (B-2), or a prepolymer obtained by reaction of a triazine derivative epoxy resin (B-1) and a acid anhydride (B-2),
(C) an inorganic filler, and
(D) a curing accelerator, wherein
the mass ratio of component (A)/component (B) is within a range from 5/95 to 95/5, and
the amount of component (C) is within a range from 100 to 1,000 parts by mass per 100 parts by mass of the combination of component (A) and component (B).

In this heat-curable silicone resin-epoxy resin composition, the heat-curable silicone resin of component (A) is preferably represented by an average composition formula (1) shown below:

$$R^1_a Si(OR^2)_b(OH)_c O_{(4-a-b-c)/2} \quad (1)$$

(wherein $R^1$ represents identical or different organic groups of 1 to 20 carbon atoms, $R^2$ represents identical or different organic groups of 1 to 4 carbon atoms, and a, b and c are numbers that satisfy $0.8 \leq a \leq 1.5$, $0 \leq b \leq 0.3$, and $0.001 \leq c \leq 1.0$ respectively, provided that $0.8 \leq a+b+c<2$).

In a preferred embodiment of the heat-curable silicone resin-epoxy resin composition, the component (B) is composed of a triazine derivative epoxy resin (B-1) and an acid anhydride (B-2).

In another preferred embodiment of the heat-curable silicone resin-epoxy resin composition, the component (B) is a solid reaction product obtained by reacting a triazine derivative epoxy resin (B-1) and an acid anhydride (B-2) such that the molar ratio of [epoxy groups within component (B-1)]/[acid anhydride groups within component (B-2)] is within a range from 0.6 to 2.0.

In the heat-curable silicone resin-epoxy resin composition of the present invention, the inorganic filler of component (C) is preferably at least one material selected from the group consisting of silica, alumina, magnesium oxide, aluminum hydroxide, and titanium oxide.

A second aspect of the present invention provides a premolded package obtained by molding the above heat-curable silicone resin-epoxy resin composition of the present invention.

A third aspect of the present invention provides an LED device comprising a premolded package obtained by molding the above heat-curable silicone resin-epoxy resin composition of the present invention, and an LED chip mounted on the package.

The heat-curable silicone resin-epoxy resin composition of the present invention has excellent curability, and yields a uniform cured product that exhibits favorable strength, displays excellent retention of heat resistance and light resistance over long periods of time, and suffers minimal yellowing. Accordingly, a premolded packaged that has been molded from a cured product of the composition of the present invention is extremely useful industrially, particularly for high-brightness LED or solar cell devices. The composition is also useful as an underfill material for an LED element.

DETAILED DESCRIPTION OF THE PREFERRED EMBODIMENTS

A more detailed description of the present invention is presented below.

<(A) Heat-Curable Silicone Resin>

Examples of the heat-curable silicone resin of the present invention include hydroxyl group-containing silicone polymers represented by general formula (1) shown below:

$$R^1_a Si(OR^2)_b(OH)_c O_{(4-a-b-c)/2} \qquad (1)$$

(wherein $R^1$ represents identical or different organic groups (and particularly hydrocarbon groups) of 1 to 20 carbon atoms, such as an alkyl group of 1 to 20 carbon atoms, alkenyl group of 2 to 20 carbon atoms, aryl group of 6 to 20 carbon atoms, or aralkyl group of 7 to 20 carbon atoms; $R^2$ represents identical or different organic groups (and particularly hydrocarbon groups) of 1 to 4 carbon atoms; and a, b and c are numbers that satisfy $0.8 \leq a \leq 1.5$, $0 \leq b \leq 0.3$, and $0.001 \leq c \leq 1.0$ respectively, provided that $0.8 \leq a+b+c<2$).

The heat-curable silicone resin represented by general formula (1) can be obtained as a hydrolysis-condensation product of an organosilane represented by an average composition formula (2) shown below:

$$R^1_d SiX_{4-d} \qquad (2)$$

(wherein $R^1$ is as defined above, X represents a halogen atom or an alkoxy group, and d is 1, 2 or 3).

The alkyl group of 1 to 20 carbon atoms represented by $R^1$ is preferably an alkyl group of 1 to 10 carbon atoms, and may be a linear, branched or cyclic group. Specific examples include a methyl group, ethyl group, n-propyl group, isopropyl group, n-butyl group, isobutyl group, sec-butyl group, tert-butyl group, pentyl group, hexyl group, octyl group, cyclopentyl group and cyclohexyl group.

The alkenyl group of 2 to 20 carbon atoms represented by $R^1$ is preferably an alkenyl group of 2 to 10 carbon atoms, and specific examples include a vinyl group, allyl group and propenyl group.

The aryl group of 6 to 20 carbon atoms represented by $R^1$ is preferably an aryl group of 6 to 10 carbon atoms, and specific examples include a phenyl group, tolyl group, xylyl group and naphthyl group.

The aralkyl group of 7 to 20 carbon atoms represented by $R^1$ is preferably an aralkyl group of 7 to 10 carbon atoms, and specific examples include a benzyl group, phenethyl group, phenylpropyl group, and naphthylmethyl group.

Of the above possibilities, $R^1$ in the above formulas (1) and (2) is most preferably a methyl group or phenyl group.

Examples of the halogen atom represented by X include a chlorine atom, fluorine atom, and the like, although a chlorine atom is preferred.

The alkoxy group represented by X is typically a group of 1 to 5 carbon atoms, and is preferably a group of 1 to 3 carbon atoms. Specific examples include a methoxy group, ethoxy group, n-propoxy group, isopropoxy group, and n-butoxy group, although a methoxy group, ethoxy group, or isopropoxy group is particularly desirable.

In the above formula (2), d is an integer of 1 to 3. In those cases where d is 2 or 3, namely in those cases where the compound contains a plurality of $R^1$ groups, the plurality of $R^1$ groups may be either the same or different. In terms of being able to obtain a solid polysiloxane, and in terms of achieving superior levels of heat resistance and ultraviolet light resistance, compounds in which d=1 are preferred.

Specific examples of the organosilane compound represented by formula (2) include diorganodichlorosilanes, organotrichlorosilanes and organotrialkoxysilanes such as methylvinyldichlorosilane, diphenyldichlorosilane, methyltrichlorosilane, ethyltrichlorosilane, phenyltrichlorosilane, vinyltrichlorosilane, methyltrimethoxysilane, methyltriethoxysilane, ethyltrimethoxysilane, ethyltriethoxysilane, phenyltrimethoxysilane, vinyltrimethoxysilane and phenyltriethoxysilane; and diorganodialkoxysilanes such as dimethyldimethoxysilane, dimethyldiethoxysilane, diphenyldimethoxysilane, diphenyldiethoxysilane, methylvinyldimethoxysilane, methylphenyldimethoxysilane and methylphenyldiethoxysilane. The use of methyltrichlorosilane is particularly preferred.

The hydrolysis and condensation of the above hydrolyzable group-containing silane compound may be conducted using normal methods, and for example, is preferably conducted in the presence of an acid catalyst such as acetic acid, hydrochloric acid or sulfuric acid, or an alkali catalyst such as sodium hydroxide, potassium hydroxide or tetramethylammonium hydroxide. For example, if a silane containing Si—Cl groups as the hydrolyzable groups is used, then the hydrochloric acid produced by adding water acts as a catalyst, and a hydrolysis-condensation product having a targeted molecular weight can be obtained.

The amount of water added during the hydrolysis and condensation of the hydrolyzable silane compound represented by formula (2) is well known to those skilled in the art, but for example, in those cases where X represents a chlorine atom, the amount of water added is typically within a range from 0.9 to 1.6 mols, and preferably from 1.0 to 1.3 mols, per 1 mol of the combined amount of hydrolyzable groups (namely, chlorine atoms) within the hydrolyzable group-containing silane compound. Provided the amount of water added satisfies this range from 0.9 to 1.6 mols, the composition described below exhibits superior workability, and the cured product of the composition exhibits excellent toughness.

The hydrolyzable group-containing silane compound is preferably hydrolyzed and used within an organic solvent such as an alcohol, ketone, ester, cellosolve or aromatic compound. Specifically, the solvent is preferably an alcohol such as methanol, ethanol, isopropyl alcohol, isobutyl alcohol, n-butanol or 2-butanol, and in terms of achieving superior curability for the composition and excellent toughness for the cured product, isopropyl alcohol is particularly desirable.

In this case, the reaction temperature for the hydrolysis and condensation is preferably within a range from 10 to 120° C., and is more preferably from 20 to 100° C. Provided the reaction temperature satisfies this range, gelling is prevented, and a solid hydrolysis-condensation product is obtained that can be used favorably in the next step.

The melting point of the component (A) obtained in this manner is typically within a range from 50 to 100° C., and is preferably from 70 to 80° C. If the melting point is less than 50° C. or greater than 100° C., then the mixing and kneading operation conducted in the next step becomes difficult.

In the above average composition formula (1), $R^2$ represents identical or different organic groups (and particularly hydrocarbon groups) of 1 to 4 carbon atoms. Examples of $R^2$ include an alkyl group or alkenyl group. Further, $OR^2$ represents a terminal group within the siloxane resin other than the silanol groups (Si—OH), and specific examples of $OR^2$ include a methoxy group, ethoxy group, propoxy group, isopropoxy group or butoxy group. In terms of the ease of availability of the raw materials, a methoxy group or isopropoxy group is preferred.

In the average composition formula (1), a, b and c are numbers that satisfy $0.8 \leq a \leq 1.5$, $0 \leq b \leq 0.3$, $0.001 \leq c \leq 1.0$, and $0.8 \leq a+b+c < 2$, and preferably satisfy $0.9 \leq a \leq 1.3$, $0.001 \leq b \leq 0.2$, $0.001 \leq c \leq 0.5$, and $0.9 \leq a+b+c \leq 1.8$. If the $R^1$ content represented by a is less than 0.8, then the cured product becomes overly hard, and preventing cracking is more difficult, whereas if the $R^1$ content a exceeds 1.5, then the number of organic groups becomes too great, and the heat resistance and ultraviolet light resistance tend to deteriorate. If the $OR^2$ content represented by b exceeds 0.3, then the number of terminal groups increases and the reactivity tends to deteriorate, which makes it difficult to cure the composition in a short period of time, thus reducing productivity. If the OH content represented by c exceeds 1.0, then the stability of the silicone resin under heat tends to deteriorate, and thickening tends to become a problem during preparation of the silicone resin-epoxy resin composition. If c is less than 0.001, then the melting point tends to become too high, and workability becomes a problem.

This type of component (A) represented by the above average composition formula (1) can generally be represented by a combination of Q units ($SiO_{4/2}$) derived from tetrafunctional silanes, T units ($R^1SiO_{3/2}$) derived from trifunctional silanes, D units ($R^1{}_2SiO_{2/2}$) derived from difunctional silanes, and M units ($R^1{}_3SiO_{1/2}$) derived from monofunctional silanes. If the component (A) is expressed using this system of notation, then the ratio of the number of mols of T units represented by $R^1SiO_{3/2}$ relative to the total number of mols of all siloxane units is preferably not less than 70 mol %, and is most preferably 90 mol % or greater. If this ratio of T units is less than 70 mol %, then not only do the heat resistance and ultraviolet light resistance deteriorate, but the coefficient of expansion for the cured silicone resin-epoxy resin composition tends to increase, resulting in a deterioration in the crack resistance and the like. The remainder of the component (A) may be composed of M, D and Q units, and the combination of these units is preferably not more than 30 mol %.

Specific examples of this type of compound represented by the above average composition formula (1) include compounds of the formulas (3) and (4), which are obtained using methyltrichlorosilane and phenyltrichlorosilane as raw materials.

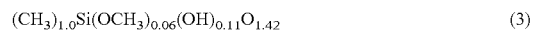

(3)

(4)

<Component (B)>

The component (B) used in the present invention is either a combination of a triazine derivative epoxy resin (B-1) and an acid anhydride (B-2) described below, or a prepolymer obtained by subjecting these components (B-1) and (B-2) to a preliminary reaction.

-(B-1) Triazine Derivative Epoxy Resin-

The triazine derivative epoxy resin used in the present invention is preferably a triazine compound with at least one epoxy group, preferably 2 to 3 epoxy groups, and particularly a 1,3,5-triazine compound. Namely, preferred are epoxy resins containing an isocyanurate ring. The epoxy resins containing an isocyanurate ring exhibit particularly superior light resistance and electrical insulation, and resins containing two, and preferably three, epoxy groups per single isocyanurate ring are particularly desirable. Specific examples of epoxy resin that may be used include tris(2,3-epoxypropyl)isocyanurate and tris(α-methylglycidyl)isocyanurate.

The softening point of the triazine derivative epoxy resin used in the present invention is preferably within a range from 90 to 125° C. In the present invention, resins containing a hydrogenated triazine ring are not included in the definition of this triazine derivative epoxy resin.

-(B-2) Acid Anhydride-

The acid anhydride of the component (B-2) used in the present invention functions as a curing agent. In order to impart improved light resistance, the acid anhydride is preferably non-aromatic, and preferably contains no carbon-carbon double bonds. Examples of the acid anhydride include hexahydrophthalic anhydride, methylhexahydrophthalic anhydride, trialkyltetrahydrophthalic anhydrides, and hydrogenated methylnadic anhydride. Of these, methylhexahydrophthalic anhydride is preferred. Any of these acid anhydride curing agents may be used individually, or two or more different acid anhydrides may be used in combination.

In those cases where the component (B) is composed of a combination of the triazine derivative epoxy resin (B-1) and the acid anhydride (B-2), the blend amount of the acid anhydride (B-2) is set such that for each 1 mol of epoxy groups within the triazine derivative epoxy resin (B-1), the amount of acid anhydride groups is within a range from 0.6 to 2.0 mols, preferably from 1.0 to 2.0 mols, and more preferably from 1.2 to 1.6 mols. If this amount of acid anhydride groups is less than 0.6 mols, then curing faults may occur, and the reliability tends to deteriorate. In contrast, if the amount of acid anhydride groups exceeds 2.0 mols, then unreacted curing agent tends to remain within the cured product, which can cause a deterioration in the moisture resistance of the resulting cured product.

In those cases where the component (B) is composed of a prepolymer obtained by subjecting the triazine derivative epoxy resin (B-1) and the acid anhydride (B-2) to a preliminary reaction, the triazine derivative epoxy resin (B-1) and the acid anhydride (B-2) are mixed together in amounts such that the molar ratio of [epoxy groups within component (B-1)]/ [acid anhydride groups within component (B-2)] is within a range from 0.6 to 2.0, and the components (B-1) and (B-2) are then reacted, preferably in the presence of an antioxidant, which is the same as component (a) described below, and/or a curing accelerator, which is the same as component (D) described below. The resulting solid product (namely, the prepolymer) can then be used as the resin composition of the component (B). In this case, the solid product is preferably crushed and used in the form of a fine powder. The particle size of the fine powder is preferably within a range from 10 µm to 3 mm. The above molar ratio is preferably within a range from 1.2 to 1.6. If the molar ratio is less than 0.6, then curing faults may occur, and the reliability tends to deteriorate. In contrast, if the molar ratio exceeds 2.0, then some acid anhydride remains as unreacted curing agent within the cured product, which can cause a deterioration in the moisture resistance of the resulting cured product. Using the above type of solid prepolymer (particularly in finely powdered form) as the component (B) is preferred, as this yields a heat-curable silicone resin-epoxy resin composition of the present invention that is a solid heat-curable resin having excellent workability.

When the prepolymer is synthesized, if required, a limited amount of other epoxy resin other than the epoxy resin (B-1) may be used in combination with the above epoxy resin (B-1), provided this does not impair the effects of the present invention. Examples of this other epoxy resin include biphenol-type epoxy resins such as bisphenol A epoxy resins, bisphenol F epoxy resins, 3,3',5,5'-tetramethyl-4,4'-biphenol epoxy resins and 4,4'-biphenol epoxy resins, phenol novolak epoxy resins, cresol novolak epoxy resins, bisphenol A novolak epoxy resins, naphthalenediol epoxy resins, trisphenylolmethane epoxy resins, tetrakisphenylolethane epoxy resins, and epoxy resins and alicyclic epoxy resins obtained by hydrogenation of the aromatic rings of phenol dicyclopentadiene novolak epoxy resins. Of these epoxy resins, from the viewpoints of heat resistance and ultraviolet light resistance, epoxy resins and alicyclic epoxy resins obtained by hydrogenation of aromatic rings are particularly desirable. The softening point of this other epoxy resin is preferably within a range from 70 to 100° C.

Specific reaction conditions for synthesizing the above prepolymer involve reacting the component (B-1) and the component (B-2), and preferably the component (B-1), the component (B-2) and an antioxidant of the component (a), at a temperature of 70 to 120° C., and preferably 80 to 110° C., for a period of 4 to 20 hours, and preferably 6 to 15 hours. Alternatively, the component (B-1), the component (B-2) and the curing accelerator of the component (D), and preferably the component (B-1), the component (B-2), the component (a) and the component (D), may be reacted at a temperature of 30 to 80° C., and preferably 40 to 60° C., for a period of 10 to 72 hours, and preferably 36 to 60 hours. This reaction yields a prepolymer as a solid product having a softening point of 50 to 100° C. and preferably 60 to 90° C. In order to blend this prepolymer into the composition of the present invention, the prepolymer is preferably first crushed to form a fine powder. If the softening point of the reaction product is less than 50° C., then it tends not to form a solid, whereas if the softening point exceeds 100° C., the required fluidity may be too low when the resulting composition is molded.

Examples of the above prepolymer include the compounds represented by general formula (5) shown below.

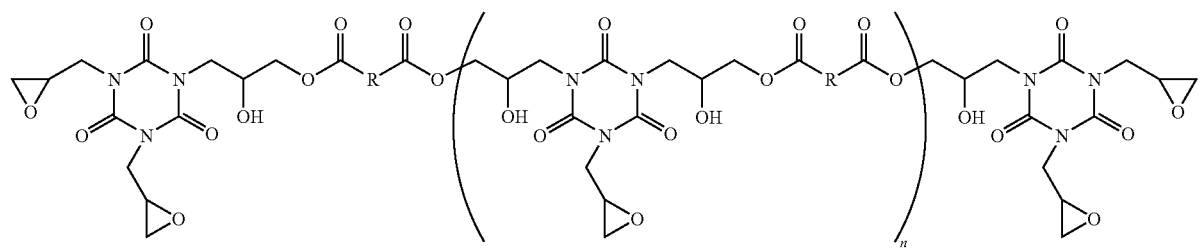

(5)

(wherein R represents an acid anhydride group, and n is an integer of 0 to 200.)

The blend ratio between component (A) and component (B) [namely, the mass ratio of (A)/(B)] is preferably within a range from 5/95 to 95/5. If this ratio of (A)/(B) is less than 5/95, then the weather resistance may be inadequate, whereas if the ratio exceeds 95/5, the strength of the cured product may be inadequate, and the reliability of the premolded package tends to deteriorate. This blend ratio (A)/(B) is more preferably within a range from 10/90 to 90/10, and is still more preferably from 20/80 to 80/20.

<(C) Inorganic Filler>

Examples of inorganic fillers of the component (C) that may be blended into the heat-curable silicone resin-epoxy resin composition of the present invention include the types of inorganic fillers used within typical epoxy resin compositions and silicone resin compositions. Specific examples include silica fillers such as fused silica and crystalline silica, alumina, magnesium oxide, aluminum hydroxide, titanium oxide, silicon nitride, aluminum nitride, boron nitride, fibrous fillers such as glass fiber and wollastonite, and antimony trioxide. Of these, silica, alumina, magnesium oxide, aluminum hydroxide and titanium oxide are preferred. Any of these inorganic fillers may be used individually, or two or more different fillers may be used in combination.

Fused silica, and especially fused spherical silica, is particularly desirable, and although there are no particular restrictions on the silica particle size, from the viewpoints of the moldability and fluidity of the resulting composition of the present invention, the average particle size is preferably within a range from 4 to 40 µm, and more preferably from 7 to 35 µm. Moreover, in order to ensure a high degree of fluidity when the composition is used as a potting material or underfill, the silica preferably comprises a combination of microparticles having an average particle size in the ultra fine particle range of 3 µm or less, microparticles having an average particle size in the midsize particle range of 4 to 8 µm, and microparticles having an average particle size in the coarse particle range of 10 to 40 μm. In those cases where a premolded package having a narrow portion is to be molded, or in those cases where the composition is to be used as an underfill material, the use of an inorganic filler having an average particle size not larger than ½ of the thickness of the narrow portion is desirable.

In order to improve the bonding strength to the resin components, the inorganic filler may be subjected to a preliminary surface treatment with a silane coupling agent or titanate coupling agent or the like.

Specific examples of these types of coupling agents include epoxy functional group-containing alkoxysilanes such as γ-glycidoxypropyltrimethoxysilane, γ-glycidoxypropylmethyldiethoxysilane and β-(3,4-epoxycyclohexyl)ethyltrimethoxysilane, amino functional group-containing alkoxysilanes such as N-β-(aminoethyl)-γ-aminopropyltrimethoxysilane, γ-aminopropyltriethoxysilane and N-phenyl-γ-aminopropyltrimethoxysilane, and mercapto functional group-containing alkoxysilanes such as γ-mercaptopropyltrimethoxysilane. There are no particular restrictions on the blend amount of the coupling agent used in the surface treatment, nor on the surface treatment method employed.

The amount used of the inorganic filler is typically within a range from 100 to 1,000 parts by mass, and preferably from 200 to 900 parts by mass, per 100 parts by mass of the combination of component (A) and component (B). If this amount is less than 100 parts by mass, then the cured product may not exhibit adequate strength, whereas if the amount exceeds 1,000 parts by mass, then thickening of the composition may cause faults resulting from incomplete encapsulation, and the loss in flexibility may cause faults such as peeling to occur inside the LED device. The inorganic filler preferably represents from 50 to 93% by mass, and more preferably 60 to 90% by mass, of the total mass of the composition of the present invention.

<(D) Curing Accelerator>

This curing catalyst is a condensation catalyst for curing the heat-curable silicone resin of component (A). Examples of this condensation catalyst include basic compounds such as trimethylbenzylammonium hydroxide, tetramethylammonium hydroxide, n-hexylamine, tributylamine, diazabicycloundecene (DBU) and dicyandiamide; metal-containing compounds such as tetraisopropyl titanate, tetrabutyl titanate, titanium acetylacetonate, aluminum triisobutoxide, aluminum triisopropoxide, aluminum tris(acetylacetonate), aluminum bis(ethylacetoacetate)-mono(acetylacetonate), zirconium tetra(acetylacetonate), zirconium tetrabutylate, cobalt octylate, cobalt acetylacetonate, iron acetylacetonate, tin acetylacetonate, dibutyltin octylate, dibutyltin laurate, zinc octylate, zinc benzoate, zinc p-tert-butylbenzoate, zinc laurate, zinc stearate; and organotitanium chelate compounds such as diisopropoxybis(ethylacetoacetate)titanium. Of these, zinc octylate, zinc benzoate, zinc p-tert-butylbenzoate, zinc laurate, zinc stearate and aluminum triisopropoxide are preferred. Zinc benzoate and organotitanium chelate compounds are particularly preferred.

The blend amount of the curing catalyst is preferably within a range from 0.01 to 10.0 parts by mass, and more preferably from 0.1 to 6.0 parts by mass, per 100 parts by mass of the combination of the components (A) and (B).

<(E) Other Additives>

Other components may also be added to the heat-curable silicone resin-epoxy resin composition of the present invention as required, provided they do not impair the objects and effects of the present invention. Representative examples of these optional components include the antioxidants (a), silicone resin curing catalysts (b), and white pigments (c) described below.

(a) Antioxidants:

Examples of antioxidants of component (a) that may be used in the heat-curable resin composition of the present invention include phenol-based, phosphorus-based and sulfur-based antioxidants. Specific examples of these antioxidants are listed below.

Examples of phenol-based antioxidants include 2,6-di-t-butyl-p-cresol, butylated hydroxyanisole, 2,6-di-t-butyl-p-ethylphenol, stearyl-β-(3,5-di-t-butyl-4-hydroxyphenyl)propionate, 2,2'-methylenebis(4-methyl-6-t-butylphenol), 4,4'-butylidene bis(3-methyl-6-t-butylphenol), 3,9-bis[1,1-dimethyl-2-{β-(3-t-butyl-4-hydroxy-5-methylphenyl)propionyloxy}ethyl]-2,4,8,10-tetraoxaspiro[5,5]-undecane, 1,1,3-tris(2-methyl-4-hydroxy-5-t-butylphenyl)butane, and 1,3,5-trimethyl-2,4,6-tris(3,5-di-t-butyl-4-hydroxybenzyl)benzene. Of these, 2,6-di-t-butyl-p-cresol is preferred.

Examples of suitable phosphorus-based antioxidants include triphenyl phosphite, diphenylalkyl phosphites, phenyldialkyl phosphites, tri(nonylphenyl) phosphite, trilauryl phosphite, trioctadecyl phosphite, distearyl pentaerythritol diphosphite, tris(2,4-di-tert-butylphenyl)phosphite, diisodecyl pentaerythritol diphosphite, di(2,4-di-tert-butylphenyl) pentaerythritol diphosphite, tristearyl sorbitol triphosphite, and tetrakis(2,4-di-tert-butylphenyl)-4,4'-biphenyl diphosphonate. Of these, triphenyl phosphite is preferred.

Examples of suitable sulfur-based antioxidants include dilauryl-3,3'-thiodipropionate, dimyristyl-3,3'-thiodipropionate, and distearyl-3,3'-thiodipropionate.

Although any of these antioxidants may be used individually, the use of either a single phosphorus-based antioxidant or a combination of a phenol-based antioxidant and a phosphorus-based antioxidant is preferred. When a mixture of a phenol-based antioxidant and a phosphorus-based antioxidant is used, the mass ratio between the two antioxidants is preferably such that [phenol-based antioxidant:phosphorus-based antioxidant]=0:100 to 70:30, and more preferably 0:100 to 50:50.

The blend amount of the antioxidant is typically within a range from 0.01 to 10 parts by mass, and preferably from 0.03 to 5 parts by mass, relative to 100 parts by mass of the resin composition of the present invention. If the blend amount is too small, then satisfactory heat resistant may be unobtainable and the cured product may be susceptible to discoloration, whereas a blend amount that is too large may inhibit curing, making satisfactory levels of curability and strength unobtainable.

(b) Curing Catalysts:

Compounds typically used as curing accelerators for epoxy resin compositions may be used as the curing accelerator of the component (D). There are no particular restrictions on this curing accelerator, and examples include one or more compounds selected from amongst tertiary amines, imidazoles, organic carboxylate salts of tertiary amines or imidazoles, metal organic carboxylates, metal-organic chelate compounds, aromatic sulfonium salts, phosphorus-based curing catalysts such as organic phosphine compounds and phosphonium compounds, and salts of these phosphorus-based curing catalysts. Of the above compounds, imidazoles and phosphorus-based curing catalysts are preferred, and specific examples include 2-ethyl-4-methylimidazole, methyl-tributylphosphonium-dimethylphosphate, and quaternary phosphonium bromide.

The amount used of the curing accelerator is typically within a range from 0.05 to 5% by mass, and preferably from 0.1 to 2% by mass, relative to the total mass of the composition. If the amount is outside this range, then the balance between heat resistance and humidity resistance for the cured product of the resulting silicone resin-epoxy resin composition may deteriorate.

(c) White Pigment

A white pigment may be added as a white colorant to improve the whiteness of the composition, and particularly in those cases where the composition of the present invention is used in the production of a premolded package for an LED, titanium dioxide is often added as a white colorant to improve the whiteness. The unit cell for this titanium dioxide may be either rutile or anatase. Furthermore, although there are no particular restrictions on the average particle size or shape of the titanium dioxide particles, a fine powder is preferred in terms of achieving good enhancement of the whiteness with a small amount of powder. In order to improve the compatibility with the resins and inorganic filler, as well as the dispersibility and the light resistance, the titanium dioxide is preferably rutile titanium dioxide that has undergone a preliminary surface treatment with a water-containing oxide of Al or Si or the like or a silane.

Furthermore, although there are no particular restrictions on the average particle size or shape of the titanium dioxide, the average particle size is typically within a range from 0.05 to 5.0 μm. In order to improve the compatibility with the resins and inorganic filler and enhance the dispersibility, the titanium dioxide may be subjected to a preliminary surface treatment with a water-containing oxide of Al or Si or the like.

The average particle size can be determined as the mass average value $D_{50}$ (or the median size) within a particle size distribution measurement conducted using a laser diffraction technique.

Other compounds besides titanium dioxide that may be used as the white pigment (white colorant) include potassium titanate, zirconium oxide, zinc sulfide, zinc oxide and magnesium oxide. These compounds may be used alone, or may be used in combination with titanium dioxide.

The amount added of the white pigment is typically within a range from 5 to 40% by mass, and preferably from 10 to 30% by mass, relative to the total mass of the composition. If this amount is less than 5% by mass, then a satisfactory level of whiteness may be unobtainable, whereas if the amount exceeds 40% by mass, then the fluidity of the composition may deteriorate, and moldability problems may arise, causing incomplete encapsulation or voids or the like.

Moreover, various other additives, including stress reduction agents such as thermoplastic resins, thermoplastic elastomers, organic synthetic rubbers and silicones, as well as waxes, silane-based and titanium-based coupling agents, and halogen trapping agents may also be added to the composition of the present invention in order to improve specific properties of the composition and/or the cured product, provided the addition of these additives does not impair the effects of the present invention.

Because the epoxy resin composition of the component (B) and the silicone resin of the component (A) are cured at substantially the same time, the catalyst (b) and the curing accelerator (D) may be combined, or in some cases, a single compound may be used as the catalyst for curing both compositions.

The blend amount of the curing catalyst of the component (b) is preferably within a range from 0.01 to 10.0 parts by mass, and more preferably from 0.1 to 6.0 parts by mass, per 100 parts by mass of the combination of the components (A) and (B).

The reflectance of the cured product obtained by curing the heat-curable silicone resin-epoxy resin composition of the present invention, relative to light of wavelength 380 to 750 nm, has an initial value of at least 70%, and following a degradation test at 180° C. for 24 hours, preferably still has a reflectance of at least 70%. If this reflectance is less than 70%, then when the cured product is used as a semiconductor element case for an LED, the usable lifetime of the device tends to be shortened.

In those cases where the composition of the present invention is used as a typical semiconductor-encapsulating material or for the encapsulation of any of a variety of vehicle-mounted modules, carbon black or the like is typically used as the colorant. Any commercially available carbon black may be used, although a high-purity carbon black containing little alkali metal or halogen is preferred.

The composition of the present invention can be prepared by blending together predetermined amounts of the silicone resin (A), the epoxy resin composition (B), the filler (C) and the curing accelerator (D), together with any of the other additives that may be added as required such as the curing catalyst (b), thoroughly mixing the components using a mixer or the like to achieve a uniform composition, conducting a molten mixing treatment using heated rollers, a kneader and/or an extruder and the like, subsequently cooling and solidifying the composition, and then crushing the product to an appropriate particle size to obtain the silicone resin-epoxy resin composition molding material.

The silicone resin-epoxy resin composition of the present invention obtained in this manner exhibits excellent moldability, and a cured product of the composition exhibits excellent heat resistance, light resistance and ultraviolet light resistance, meaning it is not only ideal for producing premolded packages for white, blue and ultraviolet LEDs, but is also ideal as a packaging material for solar cells.

Moreover, the composition of the present invention can also be used in premolded packages comprising a matrix array-type metal substrate or organic substrate having lead portions or pad portions formed thereon, wherein a batch encapsulation is conducted using the composition of the present invention so that only the LED element-mounting portions remain exposed.

Furthermore, the composition of the present invention may also be used as a typical semiconductor encapsulation material or as a material for the encapsulation of any of a variety of vehicle-mounted modules.

In this case, the most typical method used for conducting the encapsulation using the heat-curable silicone resin-epoxy resin composition of the present invention is low-pressure transfer molding. The molding of the silicone resin-epoxy resin composition of the present invention is preferably conducted at a molding temperature of 150 to 185° C. for a period of 30 to 180 seconds. Post-cuing may be performed at 150 to 185° C. for a period of 2 to 20 hours.

EXAMPLES

A more detailed description of the present invention is presented below using a series of examples and comparative examples, although the present invention is in no way limited by the following examples.

The raw materials used in the following examples and comparative examples are listed below.

(A) Heat-Curable Organopolysiloxane

Synthesis Example 1

A 1-liter flask was charged with 100 parts by mass of methyltrichlorosilane and 200 parts by mass of toluene, and with the flask cooled in an ice bath, a mixed solution containing 8 parts by mass of water and 60 parts by mass of isopropyl alcohol was added dropwise to the mixture in the flask. The dropwise addition was conducted over a period of 5 to 20 hours with the liquid inside the flask maintained at a temperature within a range from −5 to 0° C. Following completion of the dropwise addition, the reaction liquid was heated and stirred under reflux for 20 minutes. The reaction liquid was then cooled to room temperature, 12 parts by mass of water was added dropwise over a period of 30 minutes at a temperature of not more than 30° C., and the resulting mixture was stirred for a further 20 minutes. A further 25 parts by mass of water was then added dropwise to the mixture, and stirring was continued for a further 60 minutes at a temperature of 40 to 45° C. To the thus obtained mixed liquid was added 200 parts by mass of water, and the separated organic layer was extracted. This organic layer was washed until neutral, and subsequently subjected to azeotropic dehydration and filtration. The solvent was then stripped under reduced pressure, yielding 36.0 parts by mass of a heat-curable organopolysiloxane (A-1) represented by formula (6) shown below in the form of a colorless, transparent solid (melting point: 76° C.).

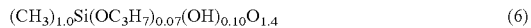

$$(CH_3)_{1.0}Si(OC_3H_7)_{0.07}(OH)_{0.10}O_{1.4} \quad (6)$$

Synthesis Example 2

A 1-liter flask was charged with 80 parts by mass of methyltrichlorosilane, 20 parts by mass of tetraethoxysilane, and 200 parts by mass of toluene, and with the flask cooled in an ice bath, a mixed solution containing 8 parts by mass of water and 60 parts by mass of isopropyl alcohol was added dropwise to the mixture in the flask. The dropwise addition was conducted over a period of 5 to 20 hours with the liquid inside the flask maintained at a temperature within a range from −5 to 0° C. Following completion of the dropwise addition, the reaction liquid was heated and stirred under reflux for 20 minutes. The reaction liquid was then cooled to room temperature, 12 parts by mass of water was added dropwise over a period of 30 minutes at a temperature of not more than 30° C., and the resulting mixture was stirred for a further 20 minutes. A further 25 parts by mass of water was then added dropwise to the mixture, and stirring was continued for a further 60 minutes at a temperature of 40 to 45° C. To the thus obtained mixed liquid was added 200 parts by mass of water, and the separated organic layer was extracted. This organic layer was washed until neutral, and subsequently subjected to azeotropic dehydration and filtration. The solvent was then stripped under reduced pressure, yielding 36.0 parts by mass of a heat-curable organopolysiloxane (A-2) represented by formula (7) shown below in the form of a colorless, transparent solid (melting point: 76° C.).

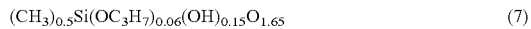

$$(CH_3)_{0.5}Si(OC_3H_7)_{0.06}(OH)_{0.15}O_{1.65} \quad (7)$$

(B1) Triazine Derivative Epoxy Resin
  tris(2,3-epoxypropyl)isocyanurate (TEPIC-S, a product name, manufactured by Nissan Chemical Industries, Ltd., epoxy equivalent weight: 100)
(B-2) Acid Anhydride
  Acid anhydride containing no carbon-carbon double bonds: methylhexahydrophthalic anhydride (RIKACID MH, a product name, manufactured by New Japan Chemical Co., Ltd.)
  Acid anhydride containing a carbon-carbon double bond: tetrahydrophthalic anhydride (RIKACID TH, a product name, manufactured by New Japan Chemical Co., Ltd.)
(C) Inorganic Fillers
  Fused spherical silica: MSR-4500TN (a product name, manufactured by Tatsumori Ltd., average particle size: 45 μm)
  Spherical alumina: a 50/50 (mass ratio) mixture of AO-809 (a product name, manufactured by Admatechs Co., Ltd., average particle size: 10 μm) and AO-820 (a product name, manufactured by Admatechs Co., Ltd., average particle size: 20 μm)
(D) Curing Accelerator
  Curing catalyst for silicone resins: Zinc benzoate (manufactured by Junsei Chemical Co., Ltd.)
(E) Other Additives
  (a) Antioxidant
  Phosphorus-based antioxidant: triphenyl phosphite (manufactured by Wako Pure Chemical Industries, Ltd.)
  Phenol-based antioxidant: 2,6-di-t-butyl-p-cresol BHT (a product name, manufactured by Wako Pure Chemical Industries, Ltd.)
  (b) Curing Catalyst
  Phosphorus-based curing catalyst: Methyl-tributylphosphonium-dimethylphosphate, PX-4MP (a product name, manufactured by Nippon Chemical Industrial Co., Ltd.)
  (c) White Pigment
  Titanium dioxide: rutile form, R-45M (a product name, manufactured by Sakai Chemical Industry Co., Ltd., average particle size: 0.29 μm)
  (d) Release Agent: Calcium Stearate Synthesis Example 3

Production of Epoxy Resin Prepolymer (Component (B))

Prepolymers (1) to (4) of the component (B) were synthesized by blending the raw material components shown in Table I in the proportions shown in the table, and then heating the mixture under predetermined reaction conditions, thereby reacting the epoxy resin (B-1) and the acid anhydride (B-2) and synthesizing the prepolymer.

TABLE 1

| | Component | Prepolymer (1) | Prepolymer (2) | Prepolymer (3) | Prepolymer (4) |
|---|---|---|---|---|---|
| (B-1) | TEPIC-S | 45 | 45 | 45 | 45 |
| (B-2) | RIKACID MH | 55 | 55 | — | 55 |
| | RIKACID TH | — | — | 55 | — |
| (E) (a) | Triphenyl phosphite | — | 3 | 3 | — |
| (D) | Zinc benzoate | — | — | — | 1 |
| | Molar ratio [epoxy groups in (B-1)/ acid anhydride groups in (B-2) | 1.4 | 1.4 | 1.4 | 1.4 |
| | Reaction conditions | 80° C./10 hr | 80° C./10 hr | 80° C./10 hr | 40° C./48 hr |

Examples 1 to 6

Comparative Examples 1 to 5

Components were blended together in the proportions shown in Table 2, and following uniform mixing, the mixture was kneaded using two heated rollers, thus forming a white silicone resin-epoxy resin composition. The physical properties of each of the prepared compositions were measured using the methods described below. The results are shown in Table 2.

<<Spiral Flow Value>>

Using a molding die prescribed in the EMMI standards, the spiral flow value was measured under conditions including 175° C., 6.9 N/mm², and a molding time of 120 seconds.

<<Melt Viscosity>>

Using a Koka-type flow tester and a nozzle with an inner diameter of 1 mm, the viscosity at a temperature of 175° C. was measured under a pressure of 25 kgf.

<<Bending Strength>>

Using a molding die prescribed in the EMMI standards, the bending strength was measured under conditions including 175° C., 6.9 N/mm², and a molding time of 120 seconds.

<<Heat Resistance and Yellowing Resistance>>

A circular disc having a diameter of 50 mm and a thickness of 3 mm was molded under conditions including 175° C., 6.9 N/mm², and a molding time of 2 minutes, and following standing for 24 hours at 180° C., the surface of the circular disc was inspected visually and the level of yellowing was evaluated using the criteria listed below.

A: colorless and transparent
B: No yellowing
C+: Faint yellow
C: Yellow
D: Yellow-brown <<Ultraviolet Light Resistance>>

A circular disc having a diameter of 50 mm and a thickness of 3 mm was molded under conditions including 175° C., 6.9 N/mm², and a molding time of 2 minutes, and the resulting circular disc was irradiated with ultraviolet light having a wavelength of 405 nm for 24 hours in an open atmosphere at a temperature of 120° C. The surface of the circular disc was then inspected visually and the level of discoloration was evaluated using the criteria listed below.

B: No yellowing
C+: Faint yellow
C: Yellow
D: Yellow-brown

TABLE 2

| | Component | | | Example 1 | 2 | 3 | 4 | 5 | 6 | Comparative example 1 | 2 | 3 | 4 | 5 |
|---|---|---|---|---|---|---|---|---|---|---|---|---|---|---|
| (A) | Curable organopolysiloxane | A-1 | | 37 | 25 | 50 | 75 | | 35 | | | 100 | 3 | 97 |
| | | A-2 | | | | | | 50 | 15 | | | | | |
| (B) | Triazine derivative epoxy resin | TEPIC-S | | 28 | | | | | | 45 | | | | |
| | Acid anhydride | RIKACID MH | | 35 | | | | | | 55 | | | | |
| | Prepolymer | (1) | | | 75 | | | 50 | | | 100 | | 97 | 3 |
| | | (2) | | | | 50 | | | | | | | | |
| | | (3) | | | | | 25 | | | | | | | |
| | | (4) | | | | | | | 50 | | | | | |
| (C) | Inorganic filler | Fused silica | | 540 | 650 | 540 | | 540 | 540 | 540 | 540 | 540 | 540 | 540 |
| | | Alumina | | | | | 790 | | | | | | | |
| (D) | Curing accelerator | Zinc benzoate | | 1 | 1 | 1 | 1 | 1 | 1 | | | 1 | 1 | 1 |
| (E) | Other additives | Titanium dioxide | | 160 | 150 | 120 | 160 | 120 | 120 | 160 | 160 | 160 | 160 | 160 |
| | | Catalyst PX-4MP | | 1 | 1 | 1 | 1 | 1 | 0.5 | 1 | 1 | | 1 | 1 |
| | | KBM803 | | 1 | 1 | 1 | 1 | 1 | 1 | 1 | 1 | 1 | 1 | 1 |
| | | Release agent | | 1 | 1 | 1 | 1 | 1 | 1 | 1 | 1 | 1 | 1 | 1 |
| Evaluations | Spiral flow | inch | | 25 | 21 | 17 | 12 | 17 | 16 | 35 | 25 | 10 | 24 | 10 |
| | Melt viscosity | Pas | | 117 | 100 | 100 | 80 | 95 | 105 | 79 | 95 | 50 | 100 | 50 |
| | Bending strength | N/mm² | | 93 | 106 | 100 | 80 | 95 | 98 | 79 | 95 | 50 | 100 | 50 |
| | Heat resistance discoloration | 180° C. × 24 hr | | B | C+ | B | A | B | B | D | D | A | D | A |
| | Ultraviolet light discoloration | 120° C. × 24 hr | | B | B | B | B | B | B | D | D | B | D | B |

Example 7

(Assembly of LED Device)

Using totally silver-plated copper lead frames, 20 top view type premolded packages were molded using each of the heat-curable silicone resin-epoxy resin compositions prepared in examples 2, 4 and 5. The molding was conducted under the following conditions.

Molding temperature: 170° C.
Molding pressure: 70 kg/cm²
Molding time: 3 minutes, followed by post-curing at 170° C. for 2 hours In all of the premolded packages obtained from the various compositions, the adhesion between the lead frame and the cured resin was excellent. Further, the light reflectance was 91% or more for all of the premolded packages obtained from the various compositions.

Subsequently, using the thus molded premolded packages, blue LED devices were assembled in the manner described below.

The LED element was bonded to a die pad on the premolded package using a silicone die bonding material (product name: LPS8433, manufactured by Shin-Etsu Chemical Co., Ltd.), and the silicone die bonding material was then cured by heating at 150° C. for one hour. Following mounting of the LED element on the die pad in this manner, the package leads and the element were connected using gold wiring. Subsequently, the LED element was covered with a silicone encapsulating material (LPS3419, manufactured by Shin-Etsu Chemical Co., Ltd.), and curing was then performed at 120° C. for one hour, and then 150° C. for a further one hour, thus completing encapsulation of the element, and completing assembly of the LED device.

Comparative Example 6

(Assembly of LED Device)

With the exception of using a premolded package molded using the resin composition of comparative example 1 instead of the heat-curable silicone resin-epoxy resin compositions prepared in examples 2, 4 and 5, an LED device was assembled using the same materials and the same conditions as example 7.

Comparative Example 7

(Assembly of LED Device)

With the exception of using a premolded package molded using a PPA resin instead of the heat-curable silicone resin-epoxy resin compositions prepared in examples 2, 4 and 5, an LED device was assembled using the same materials and the same conditions as example 7.

<<Evaluation of Adhesive Durability>>

Five of each of the LED devices assembled in example 7 and comparative examples 6 and 7 were left to stand for 48 hours in an atmosphere at 25° C. and 80% RH, and were then passed three times through a 260° C. reflow oven. Subsequently, the state of the adhesion between the package surface and the encapsulating resin, and between the element and the encapsulating resin was investigated.

In the case of the LED devices obtained in example 7, all of the devices exhibited a favorable state of adhesion, with absolutely no peeling faults. In contrast, of the LED devices obtained in comparative example 6, two of the LED devices displayed peeling faults. Further, of the LED devices obtained in comparative example 7, four of the LED devices displayed peeling faults.

What is claimed is:

1. A heat-curable silicone resin-epoxy resin composition comprising:
   (A) a heat-curable silicone resin represented by an average composition formula (1):

$$R^1_a Si(OR^2)_b(OH)_c O_{(4-a-b-c)/2} \quad (1)$$

wherein $R^1$ represents identical or different organic groups of 1 to 20 carbon atoms, $R^2$ represents identical or different organic groups of 1 to 4 carbon atoms, and a, b, and c are numbers that satisfy $0.8 \leq a \leq 1.5$, $0 \leq b \leq 0.3$, and $0.001 \leq c \leq 1.0$, respectively, provided that $0.8 \leq a+b+c < 2$,
   (B) a combination of a triazine derivative epoxy resin (B-1) and an acid anhydride (B-2), or a prepolymer obtained by reaction of a triazine derivative epoxy resin (B-1) and a acid anhydride (B-2)
   (C) an inorganic filler, and
   (D) a curing accelerator,
   wherein a mass ratio of component (A)/component (B) is within a range from 5/95 to 95/5, and
   wherein an amount of component (C) is within a range from 100 to 1,000 parts by mass per 100 parts by mass of a combination of component (A) and component (B).

2. The heat-curable silicone resin-epoxy resin composition according to claim 1, wherein the ratio of the triazine derivative epoxy resin (B-1) and the acid anhydride (B-2) is such that a molar ratio of [epoxy groups within component (B-1)]/[acid anhydride groups within component (B-2)] is within a range from 0.6 to 2.0.

3. The heat-curable silicone resin-epoxy resin composition according to claim 1, wherein the inorganic filler of component (C) is at least one material selected from the group consisting of silica, alumina, magnesium oxide, aluminum hydroxide, and titanium oxide.

4. A premolded package obtained by molding a heat-curable silicone resin-epoxy resin composition comprising:
   (A) a heat-curable silicone resin represented by an average composition formula (1):

$$R^1_a Si(OR^2)_b(OH)_c O_{(4-a-b-c)/2} \quad (1)$$

wherein $R^1$ represents identical or different organic groups of 1 to 20 carbon atoms, $R^2$ represents identical or different organic groups of 1 to 4 carbon atoms, and a, b and c are numbers that satisfy $0.8 \leq a \leq 1.5$, $0 \leq b \leq 0.3$, and $0.001 \leq c \leq 1.0$, respectively, provided that $0.8 \leq a+b+c < 2$,
   (B) a combination of a triazine derivative epoxy resin (B-1) and an acid anhydride (B-2), or a prepolymer obtained by reaction of a triazine derivative epoxy resin (B-1) and a acid anhydride (B-2), (C) an inorganic filler, and (D) a curing accelerator,
   wherein a mass ratio of component (A)/component (B) is within a range from 5/95 to 95/5, and
   wherein an amount of component (C) is within a range from 100 to 1,000 parts by mass per 100 parts by mass of a combination of component (A) and component (B).

5. An LED device comprising:
   a premolded package obtained by molding a heat-curable silicone resin-epoxy resin composition comprising:
   (A) a heat-curable silicone resin represented by an average composition formula (1):

$$R^1_a Si(OR^2)_b(OH)_c O_{(4-a-b-c)/2} \quad (1)$$

wherein $R^1$ represents identical or different organic groups of 1 to 20 carbon atoms, $R^2$ represents identical or different organic groups of 1 to 4 carbon atoms, and a, b and c are numbers that satisfy $0.8 \leq a \leq 1.5$, $0 \leq b \leq 0.3$, and $0.001 \leq c \leq 1.0$, respectively, provided that $0.8 \leq a+b+c < 2$,
   (B) a combination of a triazine derivative epoxy resin (B-1) and an acid anhydride (B-2), or a prepolymer obtained by reaction of a triazine derivative epoxy resin (B-1) and a acid anhydride (B-2),
   (C) an inorganic filler, and (D) a curing accelerator,
   wherein a mass ratio of component (A)/component (B) is within a range from 5/95 to 95/5, and an amount of component (C) is within a range from 100 to 1,000 parts by mass per 100 parts by mass of a combination of component (A) and component (B); and
   an LED chip mounted on the premolded package.

* * * * *